(12) United States Patent
Yunfeng et al.

(10) Patent No.: US 9,901,961 B2
(45) Date of Patent: Feb. 27, 2018

(54) CLEANING APPARATUS

(71) Applicant: DISCO CORPORATION, Tokyo (JP)

(72) Inventors: Yang Yunfeng, Tokyo (JP); Shojiro Yamada, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 14/556,849

(22) Filed: Dec. 1, 2014

(65) Prior Publication Data

US 2015/0151337 A1 Jun. 4, 2015

(30) Foreign Application Priority Data

Dec. 4, 2013 (JP) ................................. 2013-250959

(51) Int. Cl.
| | |
|---|---|
| *H01L 21/67* | (2006.01) |
| *B08B 3/02* | (2006.01) |
| *B08B 3/04* | (2006.01) |
| *H01L 21/02* | (2006.01) |

(52) U.S. Cl.
CPC ................ *B08B 3/04* (2013.01); *B08B 3/02* (2013.01); *H01L 21/67051* (2013.01); *H01L 21/02076* (2013.01)

(58) Field of Classification Search
CPC ....... B08B 3/02; B08B 3/04; H01L 21/02041; H01L 21/02076
See application file for complete search history.

(56) References Cited

U.S. PATENT DOCUMENTS

| | | | | |
|---|---|---|---|---|
| 2,504,216 A | * | 4/1950 | Morton | ................. B05B 7/0815 239/296 |
| 2002/0023585 A1 | * | 2/2002 | Sashihara | ........... B05B 13/0235 118/313 |
| 2003/0217762 A1 | * | 11/2003 | Kobayashi | ........ H01L 21/67051 134/2 |
| 2012/0227770 A1 | * | 9/2012 | Kaneko | ............. H01L 21/67051 134/36 |

FOREIGN PATENT DOCUMENTS

JP 2011-243833 12/2011

* cited by examiner

*Primary Examiner* — David G Cormier
(74) *Attorney, Agent, or Firm* — Greer Burns & Crain Ltd.

(57) ABSTRACT

Apparatus for cleaning a workpiece to remove foreign matter sticking to the workpiece includes a chuck table having a holding surface for holding the workpiece and a cleaning unit provided so as to face the workpiece for spraying a cleaning fluid to clean the workpiece. The cleaning unit includes a cleaning nozzle having a nozzle hole for spraying the cleaning fluid toward the workpiece, and a water film forming nozzle having an annular slit formed so as to surround the nozzle hole of the cleaning nozzle. The annular slit sprays the cleaning fluid in the form of a film having a conical shape, and extends from the annular slit to the workpiece held on the chuck table. The cleaning fluid sprayed from the nozzle hole of the cleaning nozzle has a columnar shape surrounded by the cleaning fluid sprayed from the annular slit of the water film forming nozzle.

2 Claims, 3 Drawing Sheets

CLEANING APPARATUS

BACKGROUND OF THE INVENTION

Field of the Invention

The present invention relates to a cleaning apparatus for cleaning a platelike workpiece such as a semiconductor wafer.

Description of the Related Art

A platelike workpiece such as a semiconductor wafer having a plurality of devices such as ICs formed on the front side is cut along division lines (streets), thereby dividing the workpiece into a plurality of chips corresponding to the plural devices. The workpiece processed by such cutting (dicing) is contaminated with foreign matter such as cut dust and it is therefore cleaned by a cleaning apparatus to remove this foreign matter.

The cleaning apparatus for cleaning the workpiece includes a chamber for defining a cleaning space, a rotatable chuck table for holding the workpiece in the chamber under suction, and a cleaning nozzle for spraying a cleaning fluid toward the workpiece from the upper side thereof (see Japanese Patent Laid-Open No. 2011-243833, for example). In this cleaning apparatus, the chuck table holding the workpiece under suction is rotated and the cleaning fluid is sprayed from the cleaning nozzle toward the workpiece to thereby remove the foreign matter sticking to the workpiece.

SUMMARY OF THE INVENTION

In the cleaning apparatus mentioned above, however, the cleaning fluid is sprayed under a very high pressure, so that the cleaning fluid collides with the workpiece to scatter in the form of a mist. The cleaning fluid scattering in the form of a mist contains the foreign matter such as cut dust removed from the workpiece. Accordingly, if the cleaning fluid scattering in the form of a mist sticks to the workpiece in a region already cleaned, this already cleaned region of the workpiece may be contaminated again with the foreign matter. To cope with this problem, the lower portion of the chamber is formed with an exhaust opening for exhausting air containing the cleaning fluid scattering in the form of a mist in the chamber. However, there is a problem such that the sticking of the cleaning fluid scattering in the form of a mist to the workpiece cannot be sufficiently prevented by only this exhaust opening.

It is therefore an object of the present invention to provide a cleaning apparatus which can prevent the sticking of the cleaning fluid scattering in the form of a mist to the workpiece.

In accordance with an aspect of the present invention, there is provided a cleaning apparatus for cleaning a workpiece to remove foreign matter sticking to the workpiece, including a chuck table having a holding surface for holding the workpiece; and cleaning means provided so as to face the workpiece held on the holding surface of the chuck table for spraying a cleaning fluid to clean the workpiece; the cleaning means including a cleaning nozzle having a nozzle hole for spraying the cleaning fluid toward the workpiece held on the chuck table; and a water film forming nozzle having an annular slit formed so as to surround the nozzle hole of the cleaning nozzle, the annular slit functioning to spray the cleaning fluid in the form of a film having a conical shape and extending from the annular slit to the workpiece held on the chuck table; the cleaning fluid sprayed from the nozzle hole of the cleaning nozzle having a columnar shape surrounded by the cleaning fluid sprayed from the annular slit of the water film forming nozzle.

Preferably, the cleaning fluid to be sprayed from the nozzle hole of the cleaning nozzle contains air.

As described above, the cleaning apparatus according to the present invention includes the water film forming nozzle for forming the water film of cleaning fluid extending from the slit to the workpiece so that this water film is so formed as to surround the columnar cleaning fluid sprayed from the cleaning nozzle. Accordingly, the cleaning fluid in the form of a mist generated by the collision of the cleaning fluid sprayed from the cleaning nozzle and the workpiece is prevented from scattering to the region outside the conical water film formed by the water film forming nozzle. In this manner, the region where the cleaning fluid in the form of a mist is generated is surrounded (enclosed) by the conical water film formed by the water film forming nozzle, thereby suppressing the scattering of the cleaning fluid in the form of a mist. Accordingly, it is possible to prevent the cleaning fluid scattering in the form of a mist from sticking to the workpiece.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
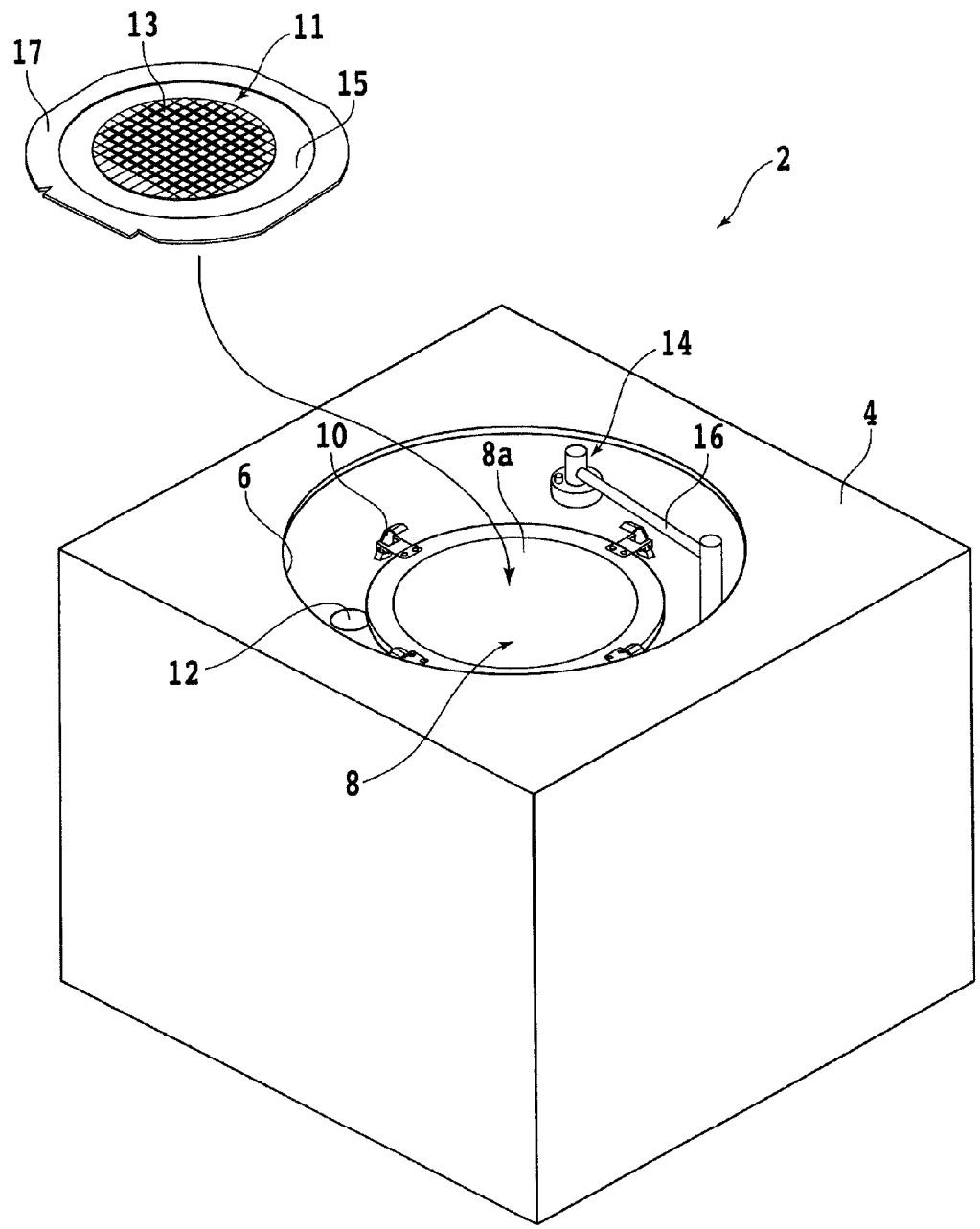
FIG. 1 is a perspective view schematically showing the configuration of a cleaning apparatus according to a preferred embodiment of the present invention.

A preferred embodiment of the present invention will now be described with reference to the attached drawings. FIG. 1 is a perspective view schematically showing the configuration of a cleaning apparatus 2 according to this preferred embodiment. In FIG. 1, there is also shown a workpiece 11 to be cleaned by the cleaning apparatus 2. As shown in FIG. 1, the cleaning apparatus 2 includes a base 4 and a chamber 6 formed as a cylindrical space inside the base 4 so as to open to the upper surface of the base 4. A disk-shaped chuck table (spinner table) 8 for holding the workpiece 11 under suction is rotatably provided in the chamber 6. Four clamps 10 for fixing an annular frame 17 supporting the workpiece 11 are mounted on the periphery of the chuck table 8. That is, in the condition where the workpiece 11 supported by the annular frame 17 is held on the chuck table 8, the annular frame 17 is fixed at four positions by the four clamps 10.

For example, the workpiece 11 is a disk-shaped semiconductor wafer. The front side of the workpiece 11 includes a central device area and a peripheral marginal area surrounding the device area. The device area is partitioned into a plurality of regions by a plurality of crossing streets (division lines), wherein a device 13 such as an IC is formed in each region. A dicing tape 15 having a diameter larger than that of the workpiece 11 is attached to the back side of the workpiece 11. The peripheral portion of the dicing tape 15 is fixed to the annular frame 17. In other words, the workpiece 11 is supported through the dicing tape 15 to the annular frame 17. The workpiece 11 shown in FIG. 1 is in the condition where it has already been processed along the streets.

The chuck table 8 is connected to a rotational drive source (not shown) such as a motor, so that the chuck table 8 is rotatable about a vertical axis. The chuck table 8 has an upper surface functioning as a holding surface 8a for holding the workpiece 11 under suction. The holding surface 8a is connected to a vacuum source (not shown) through a passage (not shown) formed in the chuck table 8. Accordingly, the workpiece 11 is held on the chuck table 8 under suction by a vacuum generated from the vacuum source and applied to the holding surface 8a.

The bottom portion of the chamber 6 is formed with an exhaust opening 12 for exhausting air or the like staying in the chamber 6 to the outside thereof. The exhaust opening 12 is connected to an exhaust pump (not shown) through a passage (not shown) formed in the base 4.

A cleaning unit (cleaning means) 14 for cleaning the workpiece 11 held on the chuck table 8 under suction is provided above the chuck table 8. The cleaning unit 14 is connected through an L-shaped support arm 16 to a driving mechanism (not shown). Accordingly, the cleaning unit 14 is pivotally movable above the chuck table 8 in the radial direction thereof by the driving mechanism.

Figure 2:
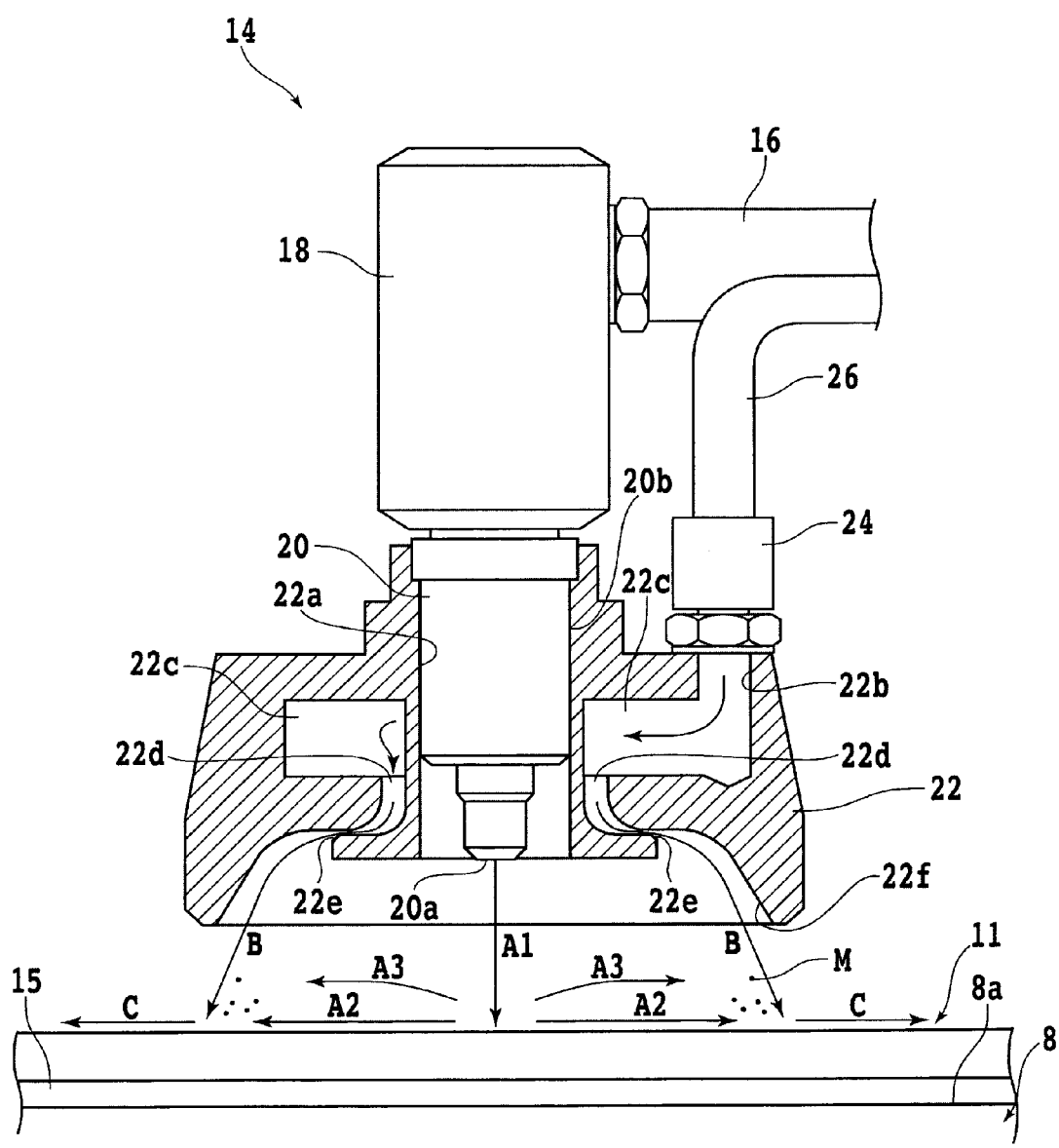
FIG. 2 is a partially sectional, enlarged side view of a cleaning unit included in the cleaning apparatus shown in FIG. 1.

FIG. 2 is a partially sectional, enlarged side view of the cleaning unit 14. In FIG. 2, there are also shown various flows of cleaning fluid to be formed by the cleaning unit 14. As shown in FIG. 2, the cleaning unit 14 includes a cylindrical cleaning nozzle 20 connected through a connecting member 18 to the support arm 16 and a water film forming nozzle 22 engaged with the cleaning nozzle 20.

A passage (not shown) for passing the cleaning fluid is formed in the cleaning nozzle 20. The upstream end of this passage is connected to a passage (not shown) formed in the support arm 16 and the connecting member 18 united together. The passage formed in the support arm 16 and the connecting member 18 is connected to a cleaning fluid source (not shown), so that the cleaning fluid is supplied from the cleaning fluid source through the passage formed in the support arm 16 and the connecting member 18 to the cleaning nozzle 20. The cleaning nozzle 20 has a lower end surface 20a, which is formed with a nozzle hole (not shown) communicating with the downstream end of the passage formed in the cleaning nozzle 20 and opening to the outside of the cleaning nozzle 20. The cleaning fluid supplied from the cleaning fluid source is sprayed from this nozzle hole toward the workpiece 11 held on the chuck table 8.

Reference symbol A1 denotes a cleaning fluid (fluid column) sprayed from the cleaning nozzle 20 toward the workpiece 11. This cleaning fluid A1 is in the form of a column perpendicular to the front side (or back side) of the workpiece 11. Preferably, the cleaning fluid A1 to be sprayed from the cleaning nozzle 20 contains air, whereby foreign matter such as cut dust sticking to the workpiece 11 can be effectively removed.

The central portion of the water film forming nozzle 22 is formed with an axial through hole 22a extending vertically. The inner circumference of the through hole 22a conforms in shape to an outer circumference 20b of the cleaning nozzle 20. Accordingly, the water film forming nozzle 22 is connected to the cleaning nozzle 20 by fitting the cleaning nozzle 20 into the through hole 22a. A connecting member 24 is located on the upper surface of the water film forming nozzle 22 at a position adjacent to the through hole 22a. A pipe 26 branched from the passage in the support arm 16 is connected through the connecting member 24 to the upper surface of the water film forming nozzle 22. There is formed in the connecting member 24 and the pipe 26 a branch passage for supplying the cleaning fluid from the cleaning fluid source to the water film forming nozzle 22.

The upper surface of the water film forming nozzle 22 is formed with a supply opening 22b. The branch passage formed in the connecting member 24 and the pipe 26 is connected through the supply opening 22b to an annular passage 22c formed in the water film forming nozzle 22. The annular passage 22c is annularly formed so as to surround the through hole 22a. That is, the annular passage 22c is formed in concentrical relationship with the through hole 22a. Accordingly, the cleaning fluid supplied to the water film forming nozzle 22 is guided around the through hole 22a by the annular passage 22c. The water film forming nozzle 22 is further formed with an annular nozzle passage 22d surrounding the through hole 22a. The nozzle passage 22d is connected at its upstream end to the lower end portion of the annular passage 22c. The nozzle passage 22d is diverged radially outward toward its downstream end. Further, the width of the nozzle passage 22d is gradually decreased toward its downstream end. The downstream end of the nozzle passage 22d is formed as an annular slit 22e for spraying the cleaning fluid supplied to the nozzle passage 22d. Like the nozzle passage 22d, the slit 22e is also formed so as to surround the through hole 22a. The gap of the slit 22e is constant over the entire circumference thereof. Further, the slit 22e is formed so that the cleaning fluid passing through the nozzle passage 22d is sprayed obliquely downward (or sideward).

As described above, the gap of the slit 22e is constant over the entire circumference thereof. Accordingly, a cleaning fluid (water film) B in the form of a film is sprayed from the slit 22e. Further, since the slit 22e is annularly formed so as to surround the through hole 22a, the columnar cleaning fluid A1 sprayed from the cleaning nozzle 20 mounted in the through hole 22a is surrounded by the cleaning fluid B sprayed from the slit 22e. Thus, the water film forming nozzle 22 is configured so as to spray the cleaning fluid B in the form of a film having a conical shape (frustoconical shape or skirtlike shape) surrounding the cleaning fluid A1 sprayed from the cleaning nozzle 20. As a result, it is possible to prevent the scattering of a cleaning fluid in the form of a mist caused by the collision of the cleaning fluid A1 and the workpiece 11. Further, the lower end portion of the water film forming nozzle 22 has an inner wall surface 22f, which is a smooth curved surface diverged radially outward toward the lower end thereof, thereby preventing the hindrance to the spray of the cleaning fluid B.

Figure 3:
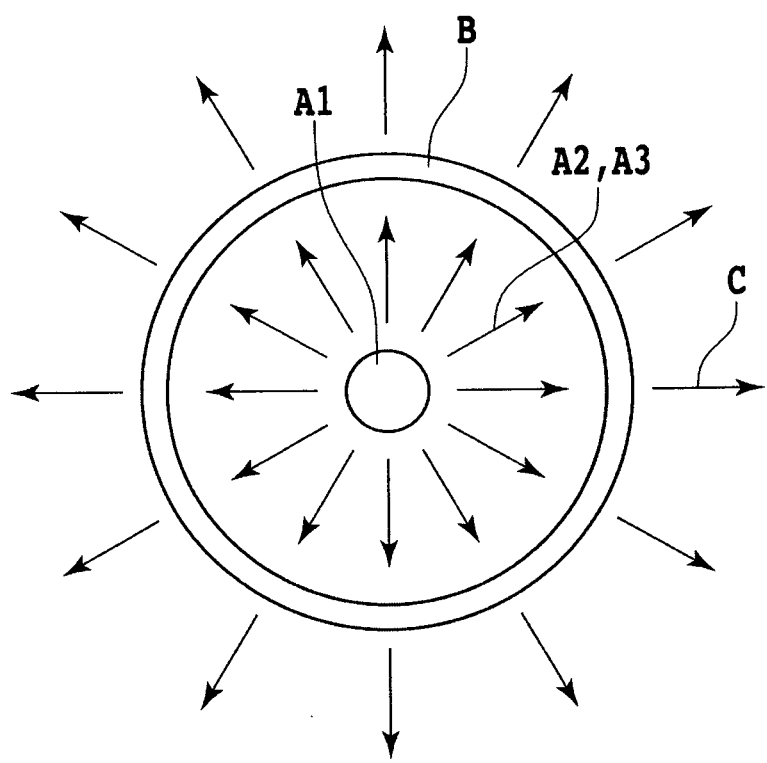
FIG. 3 is a plan view schematically showing the flows of cleaning fluid to be produced by the cleaning unit shown in FIG. 2.

There will now be described the flows of cleaning fluid to be produced by the cleaning unit 14 with reference to FIGS. 2 and 3. FIG. 3 is a plan view schematically showing the flows of cleaning fluid to be produced by the cleaning unit 14. When the cleaning of the workpiece 11 is started, the columnar cleaning fluid A1 is sprayed from the cleaning nozzle 20 of the cleaning unit 14 as shown in FIGS. 2 and 3. When the cleaning fluid A1 is sprayed onto the workpiece 11, part of the cleaning fluid A1 flows radially outward on the front side of the workpiece 11 as removing foreign matter such as cut dust present on the workpiece 11. This flow is denoted by reference symbol A2 (cleaning fluid A2). However, since the cleaning fluid A1 is sprayed under a very high pressure, another part of the cleaning fluid A1 collides with the workpiece 11 to generate a cleaning fluid A3 or M scattering in the form of a mist, wherein the cleaning fluid A3 or M is separate from the cleaning fluid A2. The cleaning fluid A3 or M scattering in the form of a mist contains foreign matter such as cut dust removed from the workpiece 11. Accordingly, if the cleaning fluid A3 or M in the form of a mist sticks to an already cleaned region of the workpiece 11, this already cleaned region is contaminated again with this foreign matter contained in the cleaning fluid A3 or M.

To cope with this problem, the cleaning apparatus 2 according to this preferred embodiment includes the water film forming nozzle 22 for spraying the cleaning fluid B in the form of a film having a conical shape surrounding the cleaning fluid A1 sprayed from the cleaning nozzle 20. Accordingly, the cleaning fluid A3 or M in the form of a mist can be captured by the cleaning fluid B in the form of a film, thereby preventing the cleaning fluid A3 or M from scattering to a region outside the cleaning fluid B. After capturing the cleaning fluid A3 or M in the form of a mist, the cleaning fluid B joins the cleaning fluid A2 flowing radially outward on the front side of the workpiece 11, thereby becoming a cleaning fluid C flowing radially outward on the front side of the workpiece 11. Thereafter, the cleaning fluid C is discharged to the outside of the workpiece 11.

As described above, the cleaning apparatus 2 according to this preferred embodiment includes the water film forming nozzle 22 for spraying (forming) the cleaning fluid (water film) B in the form of a film extending from the slit 22e to the workpiece 11 so that this film is so formed as to surround the columnar cleaning fluid A1 sprayed from the cleaning nozzle 20. Accordingly, the cleaning fluid A3 or M in the form of a mist generated by the collision of the cleaning fluid A1 sprayed from the cleaning nozzle 20 and the workpiece 11 is prevented from scattering to the region outside the cleaning fluid B in the form of a film sprayed from the water film forming nozzle 22. In this manner, the region where the cleaning fluid A3 or M in the form of a mist is generated is surrounded (enclosed) by the cleaning fluid B in the form of a film sprayed from the water film forming nozzle 22, thereby suppressing the scattering of the cleaning fluid A3 or M in the form of a mist. Accordingly, it is possible to prevent the cleaning fluid A3 or M scattering in the form of a mist from sticking to the workpiece 11.

The present invention is not limited to the above preferred embodiment, but various modifications may be made. For example, while the water film forming nozzle 22 is a one-piece unit in this preferred embodiment, the water film forming nozzle 22 may include a plurality of parts.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cleaning apparatus for cleaning a semiconductor wafer to remove foreign matter sticking to said semiconductor wafer, comprising:
   cleaning fluid; and
   a chuck table having
      a holding surface for holding said semiconductor wafer; and
      a vacuum source generating a vacuum to hold the semiconductor wafer on the chuck table by suction,
   cleaning means provided so as to face said semiconductor wafer held on said holding surface of said chuck table for spraying said cleaning fluid to clean said semiconductor wafer;
   said cleaning means including:
      a cleaning nozzle having a nozzle hole for spraying said cleaning fluid toward said semiconductor wafer held on said chuck table; and
      a water film forming nozzle having an annular slit formed so as to surround said nozzle hole of said cleaning nozzle, said annular slit opening toward the semiconductor wafer obliquely outward of the cleaning nozzle, said annular slit functioning to spray said cleaning fluid in the form of a film having a conical shape and extending from said annular slit to said semiconductor wafer held on said chuck table;
   said cleaning fluid sprayed from said nozzle hole of said cleaning nozzle having a columnar shape surrounded by said cleaning fluid sprayed from said annular slit of said water film forming nozzle,
   wherein said cleaning fluid is sprayed from both the cleaning nozzle and the water film forming nozzle.

2. The cleaning apparatus according to claim 1, wherein said cleaning fluid to be sprayed from said nozzle hole of said cleaning nozzle contains air.

* * * * *